United States Patent
Abrams et al.

(10) Patent No.: US 8,413,704 B2
(45) Date of Patent: Apr. 9, 2013

(54) NANOTUBE NETWORK AND METHOD OF FABRICATING THE SAME

(75) Inventors: Zeev Abrams, Jerusalem (IL); Yael Hanein, Caesarea (IL); Miron Hazani, Haifa (IL); Ori Cheshnovsky, RaAnana (IL); Zvi Ioffe, Givataim (IL)

(73) Assignee: Ramot at Tel-Aviv University Ltd., Tel-Aviv (IL)

( * ) Notice: Subject to any disclaimer, the term of this patent is extended or adjusted under 35 U.S.C. 154(b) by 1255 days.

(21) Appl. No.: 12/155,089

(22) Filed: May 29, 2008

(65) Prior Publication Data
US 2009/0095412 A1 Apr. 16, 2009

Related U.S. Application Data

(60) Provisional application No. 60/924,739, filed on May 30, 2007.

(51) Int. Cl.
*B32B 37/00* (2006.01)
(52) U.S. Cl.
USPC ........................................ 156/581; 156/580

(58) Field of Classification Search .................. 156/228, 156/580, 581, 583.1
See application file for complete search history.

(56) References Cited

U.S. PATENT DOCUMENTS

| | | | |
|---|---|---|---|
| 5,846,464 A * | 12/1998 | Hoffman | 264/219 |
| 6,628,053 B1 * | 9/2003 | Den et al. | 313/310 |
| 7,189,430 B2 | 3/2007 | Ajayan et al. | |
| 2004/0232426 A1 | 11/2004 | Graham et al. | |
| 2007/0153363 A1 * | 7/2007 | Gruner | 359/315 |

OTHER PUBLICATIONS

Wei et al. "Organized Assembly of Carbon Nanotubes. Cunning Refinements Help to Customize the Architecture of Nanotube Structures", Nature, 416: 495-496, Apr. 4, 2002.
Abrams et al. "A Complete Scheme for Creating Predefined Networks of Individual Carbon Nanotubes", Nano Letters, 7(9): 2666-2671, 2007.

* cited by examiner

*Primary Examiner* — James Sells

(57) ABSTRACT

A stamping device for stamping a nanotube network onto a target substrate is disclosed. The device comprises a template structure having a support structure formed on or attached to a substrate, and a plurality of nanotubes being supported by the support structure and engaging a plane which is spatially separated from the substrate.

6 Claims, 14 Drawing Sheets

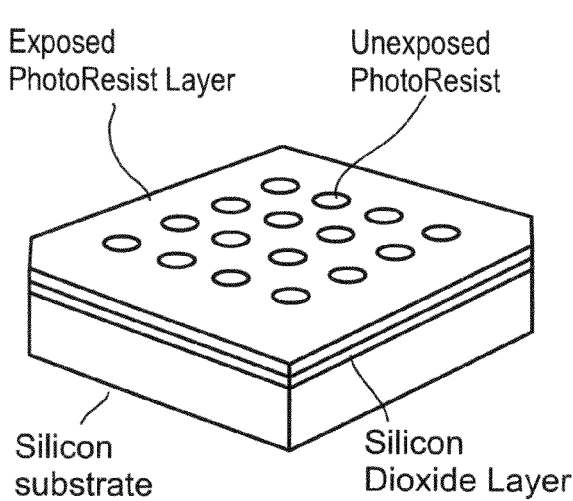
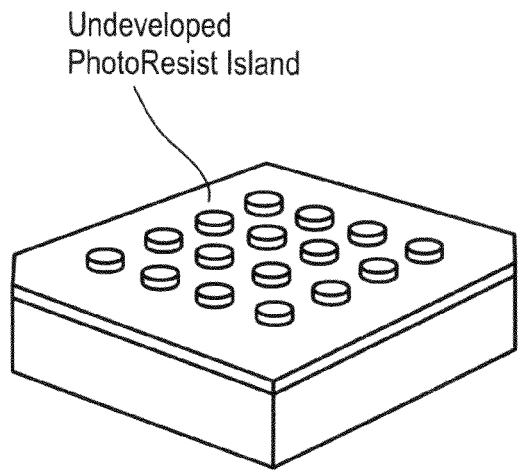
Fig. 9a
Fig. 9b
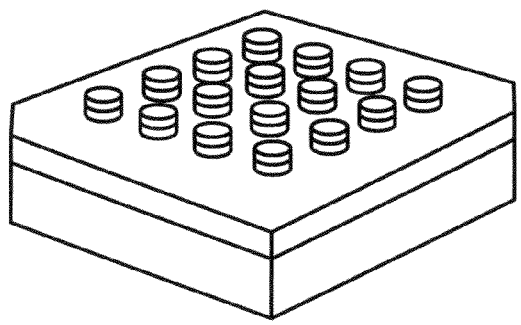
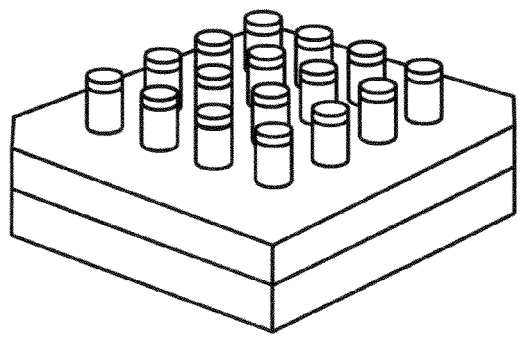
Fig. 9c
Fig. 9d
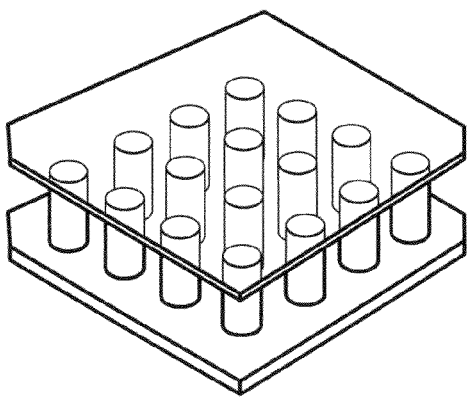
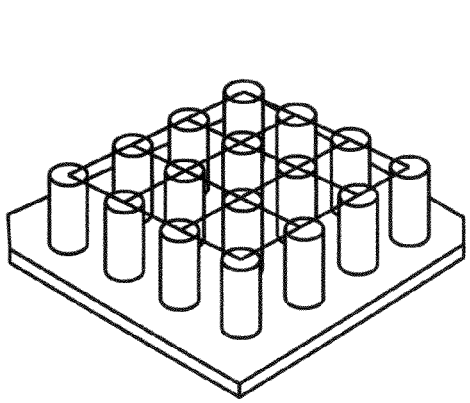
Fig. 9e
Fig. 9f

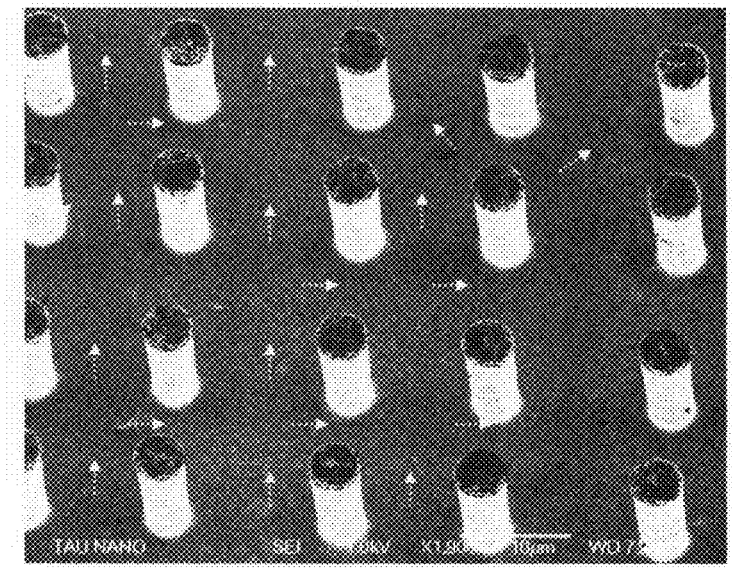
Fig. 10
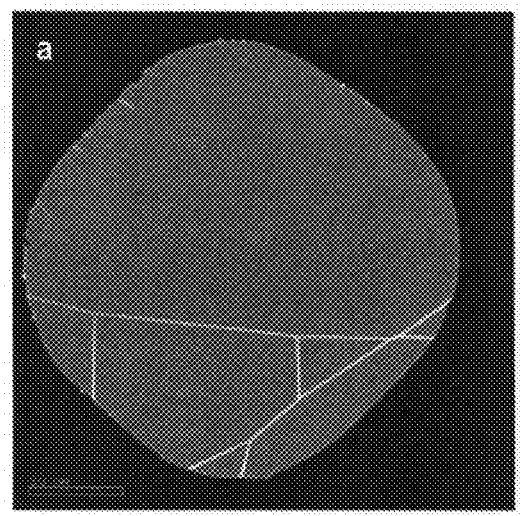 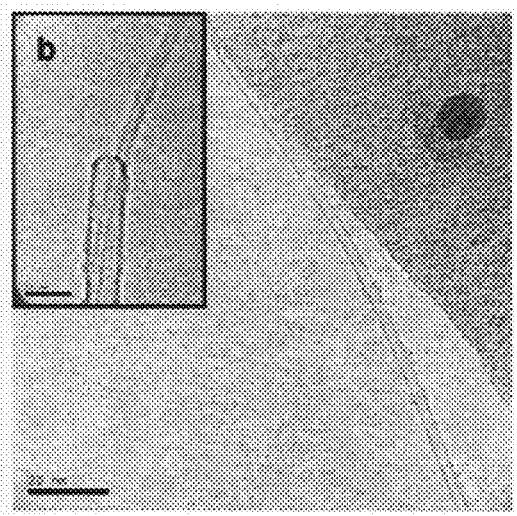
Fig. 11a  Fig. 11b

Figs. 15a-d

NANOTUBE NETWORK AND METHOD OF FABRICATING THE SAME

RELATED APPLICATIONS

This application claims the benefit of U.S. Provisional Patent Application No. 60/924,739 filed May 30, 2007, the contents of which are hereby incorporated by reference as if fully set forth herein.

FIELD AND BACKGROUND OF THE INVENTION

The present invention, in some embodiments thereof, relates to nanotechnology and, more particularly, but not exclusively, to a nanotube network and a method of fabricating a nanotube network.

Nanotechnology is a technological field which involves structures and processes in ultra-small spatial dimensions. Small structures are of interest from a fundamental point of view since they can have well-defined properties. With the ability to precisely control material properties comes new opportunities for technological and commercial development, and applications of nanostructures have been shown or proposed in areas as diverse as micro- and nanoelectronics, nanofluidics, coatings, paints and biotechnology.

Numerous configurations have been proposed and applied for the construction of nanostructures. Most widely used are the fullerene carbon nanotubes. Two major forms of carbon nanotubes exist, single-walled nanotubes (SWNT), which can be considered as long wrapped graphene sheets and multi walled nanotubes (MWNT) which can be considered as a collection of concentric SWNTs with different diameters. A typical diameter of a SWNT is less of the order of a few nanometers and a typical diameter of a MWNT is of the order of a few tens to several hundreds of nanometers.

Carbon nanotubes gain attraction in nanotechnology because of their unique electrical and mechanical properties for use in constructing nanoscale electronic circuitry and mechanical devices. It has been discovered that the electrical properties of a carbon nanotube vary as a function of its chirality, the angle at which the graphitic lattice spirals about the tubular contour of the nanotube. Electrical properties of carbon nanotubes can vary between metallic, highly conductive structures and semiconducting structures.

U.S. Pat. No. 7,189,430 teaches a method of making carbon nanotubes. A nanotube source gas is provided onto a substrate containing a template structure. The carbon nanotubes are grown on two surfaces of the template structure but not on exposed portions of the substrate material which supports the template structure. The grown carbon nanotubes are controllably aligned in a direction perpendicular to the respective surfaces of the template structure.

U.S. Published Application No. 20040232426 discloses a nanotube array and a method for producing a nanotube array. The nanotube array has a substrate, a catalyst layer on the surface of the substrate and nanotubes which are arranged on the surface of the catalyst layer, parallel to the surface of the substrate.

SUMMARY OF THE INVENTION

The present embodiments relate to a network of nanotubes. The nanotubes can be individually arranged layerwise in any arrangement. Optionally, two or more of the nanotube intersect each other. In some embodiments of the present invention the nanotubes in the network are identified according to their location and optionally one or more characteristics such as, but not limited to, diameter and chirality. Thus, the present embodiments provide a network of nanotubes having a well-defined characteristic architecture. In various exemplary embodiments of the invention the nanotubes are carbon nanotubes, more preferably single-walled carbon nanotubes. In some embodiments of the present invention at least one of the nanotubes is long (e.g., above 10 μm, more preferably above 20 μm, more preferably above 30 μm in length). In some embodiments of the present invention at least one of the nanotubes is long and substantially straight (e.g., with no more than 10% deviation from a straight line).

The present embodiments also relate to a method suitable for manufacturing the nanotubes networks. The method of the present embodiments utilizes a novel process to fabricate a network of individual nanotubes which is suspended over and being spaced apart from a substrate. The suspension of the nanotubes network is facilitated by means of a template structure which typically includes the substrate and an arrangement of pillars over the substrate. In various exemplary embodiments of the invention the template structure and the suspended nanotubes network are used as a stamping device in which case the nanotubes are transferred by stamping to a target substrate.

Using the method of the present embodiments, the nanotubes can be transferred onto surfaces that would otherwise be unsuitable for traditional nanotube growth techniques. This is because method of the present embodiments is typically not surface dependant. In various exemplary embodiments of the invention the method does not rely on excessive heating or aggressive chemical treatments.

The method of the present embodiments allows the construction of large, ordered and identifiable networks of nanotubes which unachievable by traditional techniques. For example, the present embodiments can provide large scale nanotubes grids, where the nanotubes in the grid are positioned at predetermined location on a target substrate, thus allowing the fabrication of complex circuitry using individually isolated nanotubes. The target substrate can then be used as a substrate material to form a variety of nanotube based electronic devices, including, without limitation, nanoelectronic detection device, transparent circuit boards, field emission cathodes, display devices, light emitting devices, transistors, diodes, memory media, sensors, switches and the like.

According to an aspect of some embodiments of the present invention there is provided a stamping device for stamping a nanotube network onto a target substrate. The stamping device comprises a template structure having a support structure formed on or attached to a substrate. The stamping device further comprises a plurality of nanotubes, being detachably supported by the support structure to engage a plane being spatially separated from the substrate.

According to an aspect of some embodiments of the present invention there is provided a nanotube network. The nanotube network comprises: a plurality of spatially separated pillars arranged generally perpendicularly to a substrate, and a plurality of nanotubes, supported by the pillars to engage a plane being spatially separated from the substrate. In some embodiments of the present invention at least one pillar supports an intersection of at least two non-parallel nanotubes.

According to some embodiments of the invention the spatially separated pillars are arranged in two-dimensional arrangement such that at least three pillars are not aligned along a single straight line.

According to some embodiments of the present invention the device and/or network are associated with a nanotube characteristics map identifying each nanotube according to a location and at least one characteristic selected from the group consisting of a characteristic diameter and a characteristic chirality.

According to an aspect of some embodiments of the present invention there is provided a method of fabricating a nanotube network. The method comprises: forming a template structure having a support structure formed on or attached to a substrate; and growing a plurality of nanotubes on the template structure such that the nanotubes are detachably supported by the support structure to engage a plane which is spatially separated from the substrate.

According to an aspect of some embodiments of the present invention there is provided a method of fabricating a nanotube network. The method comprises: forming a template structure having a plurality of spatially separated pillars arranged generally perpendicularly to a substrate; and growing a plurality of nanotubes on the template structure such that the nanotubes are supported by the pillars to engage a plane which is spatially separated from the substrate, wherein at least one pillar supports an intersection of at least two non-parallel nanotubes.

According to some embodiments of the invention the method further comprises transferring the nanotubes from the template structure to a target substrate.

According to some embodiments of the invention the transferring of the nanotubes is by stamping.

According to some embodiments of the invention the method further comprises analyzing the nanotubes, so as to map at least one of: characteristic diameters and characteristic chiralities of the nanotubes.

According to an aspect of some embodiments of the present invention there is provided a method of fabricating a nanotube network on a target substrate. The method comprises: providing a template structure having a support structure formed on or attached to a substrate, and a plurality of nanotubes detachably supported by the support structure and engaging a plane being spatially separated from the substrate; and contacting the stamping device and the target substrate so as to transfer the nanotubes from the template structure to a target substrate.

According to some embodiments of the invention the support structure comprises a plurality of spatially separated pillars arranged generally perpendicularly to the substrate.

According to an aspect of some embodiments of the present invention there is provided a method of fabricating a microelectronic device. The method comprises fabricating a nanotube network on a target substrate as described herein and forming on the target substrate a plurality of electrical contacts contacting at least a few of the nanotubes, thereby fabricating the microelectronic device.

According to some embodiments of the invention at least a few of the nanotubes are arranged to serve as interconnecting conductors in the microelectronic device According to some embodiments of the invention at least a few of the nanotubes are arranged to serve as active nanoelectronic devices in the microelectronic device.

According to some embodiments of the invention the active nanoelectronic devices comprise at least one nanotube transistor.

According to some embodiments of the invention the active nanoelectronic devices comprise at least one nanotube diode.

According to some embodiments of the invention the active nanoelectronic devices comprise at least one supercapacitor.

According to some embodiments of the invention the active nanoelectronic devices comprise at least one light emitter, e.g., IR emitter.

According to some embodiments of the invention the active nanoelectronic devices comprise at least one electron emitter.

According to some embodiments of the invention the microelectronic device is constituted for emitting light.

According to some embodiments of the invention the microelectronic device is constituted as a detection device.

According to some embodiments of the invention the microelectronic device is constituted as micro-fluidic flow sensing device.

According to some embodiments of the invention the microelectronic device is constituted as a memory medium.

According to some embodiments of the invention the microelectronic device is constituted as a field emission cathode.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE DRAWINGS

Some embodiments of the invention are herein described, by way of example only, with reference to the accompanying drawings and images. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIG. 1b is a schematic illustration of a nanotube characteristics map corresponding to the nanotube network illustrated in FIG. 1a;

FIGS. 9a-g are schematic illustrations depicting several stages in the fabricating of a suspended nanotube network, according to various exemplary embodiments of the present invention;

FIG. 10 is a high-resolution scanning electron microscopy (HRSEM) image showing silicon pillars with bridging carbon nanotube growth, as prepared in an experiment performed according to various exemplary embodiments of the present invention;

FIGS. 11a-b shows low (FIG. 11a) and high (FIG. 11b) magnification transmission electron microscopy (TEM) images of nanotubes grown in an experiment performed according to various exemplary embodiments of the present invention directly over a hole in a TEM grid;

DESCRIPTION OF SPECIFIC EMBODIMENTS OF THE INVENTION

Figure 1A:
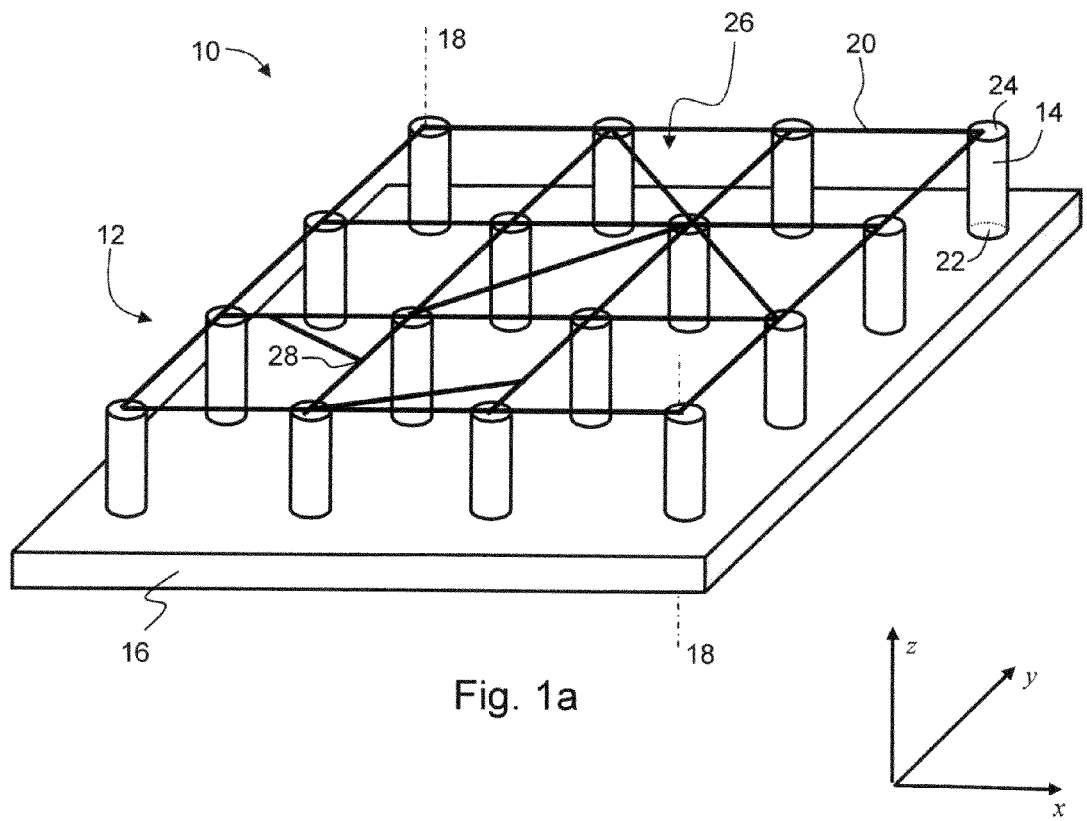
FIG. 1a is a schematic illustration of a suspended nanotube network, which, in some embodiments of the present invention can be used as a nanotube stamping device.

The present invention, in some embodiments thereof, relates to nanotechnology and, more particularly, but not exclusively, to a nanotube network and a method of fabricating a nanotube network.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Referring now to the drawings, FIG. 1a illustrates a nanotube network 10, according to various exemplary embodiments of the present invention. Nanotube network 10 comprises a template structure, generally shown at 12, having a support structure 14 formed on or attached to a substrate 16. Substrate 16 is typically planar. Support structure serves for supporting the nanotubes of network 10 as further detailed hereinafter. In the embodiment illustrated in FIG. 1a, support structure 14 is shown as a plurality of spatially separated pillars. However, this need not necessarily be the case, since, for some applications, it may not be necessary for support structure 14 to be shaped as pillars. For example, support structure 14 can have the shape of a grooved grating or the like. Further, although support structure 14 is illustrated as comprising 16 pillars, this need not necessarily be the case, since, for some applications the number of pillars is not necessarily 16. Yet, in various exemplary embodiments of the invention at least two pillars are used.

When two or more pillars are employed, they are preferably arranged generally perpendicularly to substrate 16.

The term "generally perpendicularly" refers to an angular relationship between the pillar and a plane, e.g., the surface of substrate 16. The pillars are said to be generally perpendicular to the plane if the angle between the pillars and the normal to the plane is, on the average, less than 10°, more preferably less than 5°, more preferably less than 2°, say 1° or less.

In some embodiments, the pillars are arranged in two-dimensional arrangement such that three or more pillars are not aligned along a single straight line. For example, the pillars can be arranged gridwise, as illustrated in the exemplified illustration of FIG. 1a.

Depicted in FIG. 1a is a right-handed Cartesian coordinate system, oriented such that substrate 16 is parallel to the x-y plane and the longitudinal axes 18 of pillars 14 are parallel to the z axis (for clarity of presentation only two longitudinal axes 18 are shown in FIG. 1a). Thus, each pillar can have an addressable x-y location at the point of contact between the pillar and the substrate and all the addressable x-y locations can form a grid over the surface of the substrate.

The spacing between adjacent pillars is preferably selected so as to allow them to support nanotubes. A typical spacing between two adjacent pillars is of the order of a few tens of micrometers or a few hundreds of micrometers.

The pillars can have any shape, including, without limitation, a generalized cylinder (i.e., a cylinder which is not necessarily circular), a cuboid and the like. Each of the pillars typically has two generally planar surfaces which are parallel to the x-y plane, which surfaces are referred to herein as a proximal surface 22 and a distal surface 24 relative to substrate 16. Preferably, the pillars are elongated with a length to diameter ratio which is larger than 1. The sizes of the pillars are typically, but not obligatorily, in the micrometer scale. For example, the height of an individual pillar can be any diameter from about 10 μm to about 50 μm, and the diameter of an individual pillar can be any diameter from about 1 μm to about 10 μm.

Nanotube network 10 further comprises a plurality of nanotubes 20 which are supported by support structure 14, such that engage a surface (generally shown at 26) which is spatially separated from substrate 16. When support structure 14 has the form of pillars, nanotubes 20 are supported by the distal surfaces 24 of the pillars. Thus, nanotubes 20 engage a surface (generally shown at 26) which is spatially separated from substrate 16. Surface 26 is defined by the collection of surfaces 24. Typically, surface 26 is planar.

Nanotubes 20 can be of any type, diameter and length, with the provision that their diameter in the sub-micron scale (e.g., several nanometers to several hundreds of nanometers, or several nanometers to several tens of nanometers) and that their length is of the order of the spacing between adjacent pillars. Representative examples for nanotubes suitable for the present embodiments include, without limitation, carbon nanotubes, either single-walled or multi-walled. A suitable method for growing nanotubes 20 in a manner such that they are suspended over substrate 16 is described hereinafter.

Nanotubes 20 span a suspended network above substrate 16. Typically, intersections between nanotubes are established on the proximal surfaces 24 of pillars 14. In various exemplary embodiments of the invention at least one of the pillars supports an intersection of two or more non-parallel nanotubes. Yet, intersections between non-parallel nanotubes can also be suspended without support as shown, for example, at 28.

A carbon nanotube is based on a planar sheet of $sp^2$-bonded carbon. It is commonly acceptable to characterize such sheet by a chiral vector connecting two carbon atoms of the sheet which coincide after folding. The chiral vector is perpendicular to the axis of the nanotube and its length corresponds to the circumference of the nanotube. Mathematically, the chiral vector is defined on a corresponding hexagonal lattice as a linear combination of two independent base vectors, commonly denoted $a_1$, and $a_2$, spanning the lattice. Typically, but not obligatorily, the base vectors $a_1$, and $a_2$ are unit vectors. The coefficients of $a_1$ and $a_2$ form a pair, commonly denoted (n, m), which is referred to as the chirality of the carbon nanotube. Broadly speaking, the chirality expresses the rotation of the symmetry of carbon atoms along the axis of the tube. When one of the coefficients is zero, the carbon nanotube is referred to as a "zigzag nanotube", when the two coefficients equal, the carbon nanotube is referred to as an "armchair nanotube", and a carbon nanotube characterized by two non-zero and different coefficients is referred to as "chiral nanotube".

When nanotubes 20 are carbon nanotubes, any of the nanotubes can be a zigzag nanotube, an armchair nanotube or a chiral nanotube.

Figure 1B:
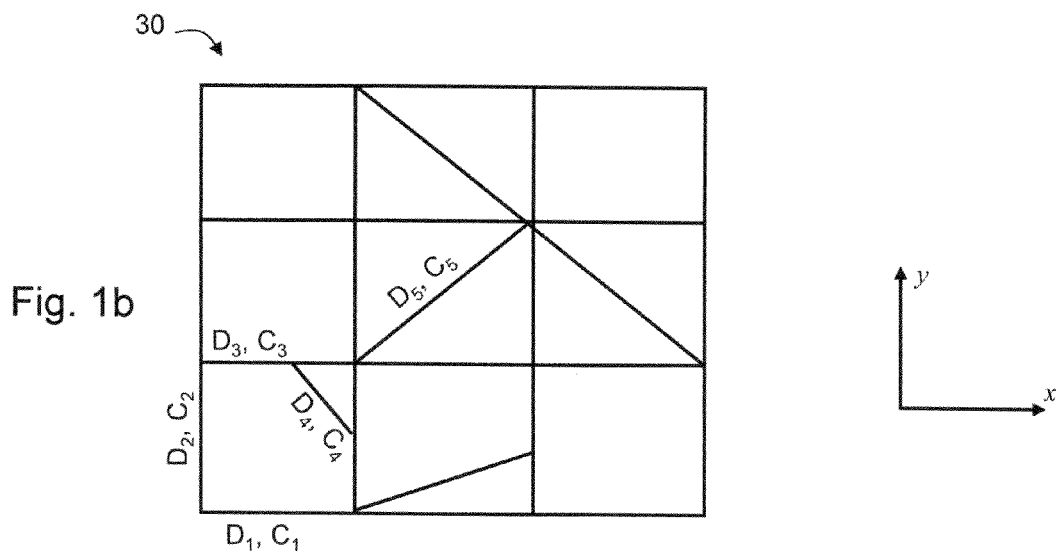

In various exemplary embodiments of the invention the nanotube 20 are associated with a nanotube characteristics map which identifies each nanotube according to its location (e.g., the x-y locations of its two endpoints) and one or more additional characteristics, such as, but not limited to, a characteristic diameter and a characteristic chirality. A representative of such nanotube characteristics map 30 is illustrated in FIG. 1b where the individual nanotubes are represented on a two-dimensional grid (hence being identified by their locations) and are associated with pairs $(D_i, C_i)$ of characteristics, $D_i$ being the characteristic diameter and $C_i$ being the characteristic chirality of the ith nanotube. For clarity of presentation, only a few nanotubes are associated with a pair of characteristics, but map 30 can include more such pairs, preferably one pair for each nanotubes. Other forms of nanotube characteristics map are not excluded from the scope of the present invention.

In various exemplary embodiments of the invention nanotubes 20 are detachably supported by surfaces 24 pillars 14. The nanotubes are "detachably supported" in the sense that when nanotube network 10 contacts or being pressed against a target substrate, nanotubes 20 are detached from template structure surfaces 24 and are being transferred from template structure 12 to the target surface. The detachment can be solely the result of the contact and/or pressure between the pillars and the target surface, or it can be facilitated by additional means, such as, but not limited to, heat, buffering medium or the like.

When nanotubes 20 are detachable, template structure 12 and nanotubes 20 can serve as a stamping device for forming a nanotube network on a target substrate. Such nanotube network can be used for fabricating a microelectronic device on the target substrate. Once stamped on the target substrate, the nanotube can serve as interconnecting conductors and/or active components such as, but not limited to, diodes, transistors, supercapacitors, light emitters and electron emitters.

It is appreciated that as ongoing miniaturization continues, conventional silicon microelectronics will reach its limit. In particular, conventional microelectronic devices with densely arranged components will in principle encounter physical problems and limits. This is because the effects of quantum mechanical phenomena increase as the feature sizes drop below about 80 nm and become dominant as at feature sizes of approximately 30 nm. Additionally, when conventional silicon microelectronic chip carry large integration density of the components thereon a dramatic increase in waste heat is generated.

On account of the properties of the nanotube network of the present embodiments, it is suitable for a wide range of applications, such as, but not limited to, for establishing electrical connection in integrated circuits or as active nanoelectronic devices, including, without limitation, diodes, transistors, supercapacitors, light emitters, electron emitters and the like.

The technique developed by the present inventors for forming a nanotube network on a target substrate is suitable for arranging the nanotubes in a defined manner at specific locations of a substrate, or equivalently, to design the location of the various active components of the microelectronic device according to the locations of the nanotubes on the substrate and according to their characteristics, e.g., using nanotube characteristics map 30. By way of example, several nanotubes in the network can be used as conductors in order to couple two conductor levels of a microcircuit element which are electrically separated from one another. At the same time, certain regions of the target substrate can remain clear of nanotubes in order to prevent electrical short circuits between other components.

Figure 2:
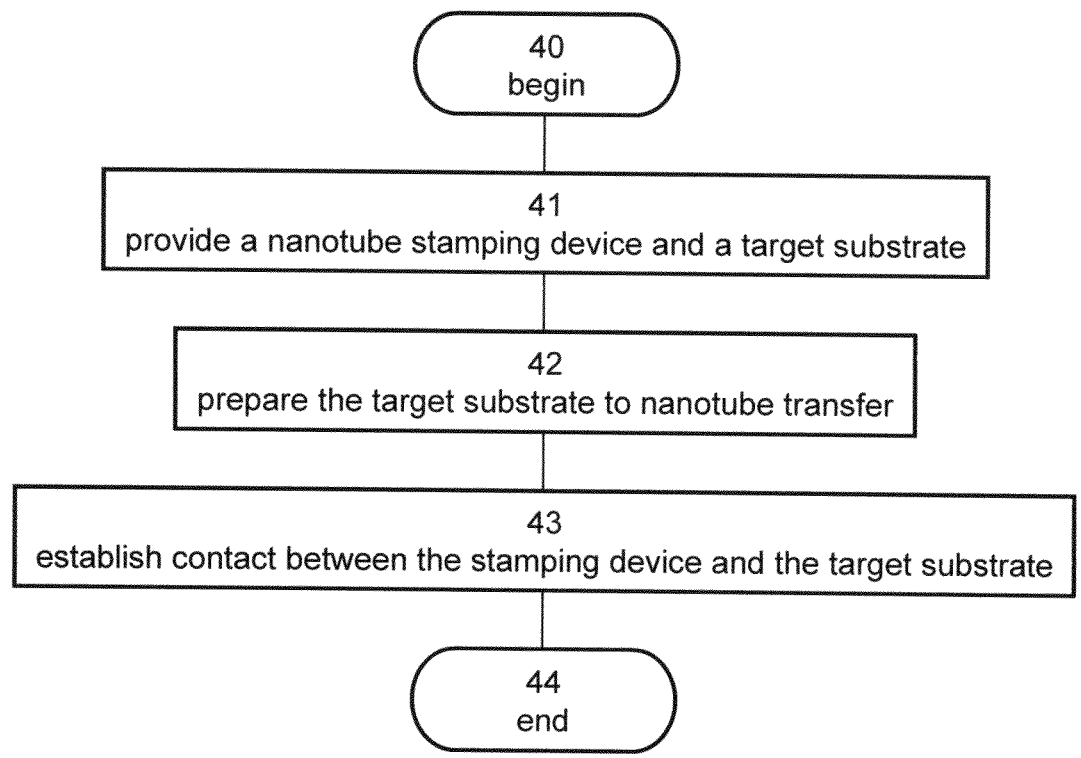
FIG. 2 is a flowchart diagram of a method suitable for forming a nanotube network on a target substrate, according to various exemplary embodiments of the present invention.
Figure 3A:
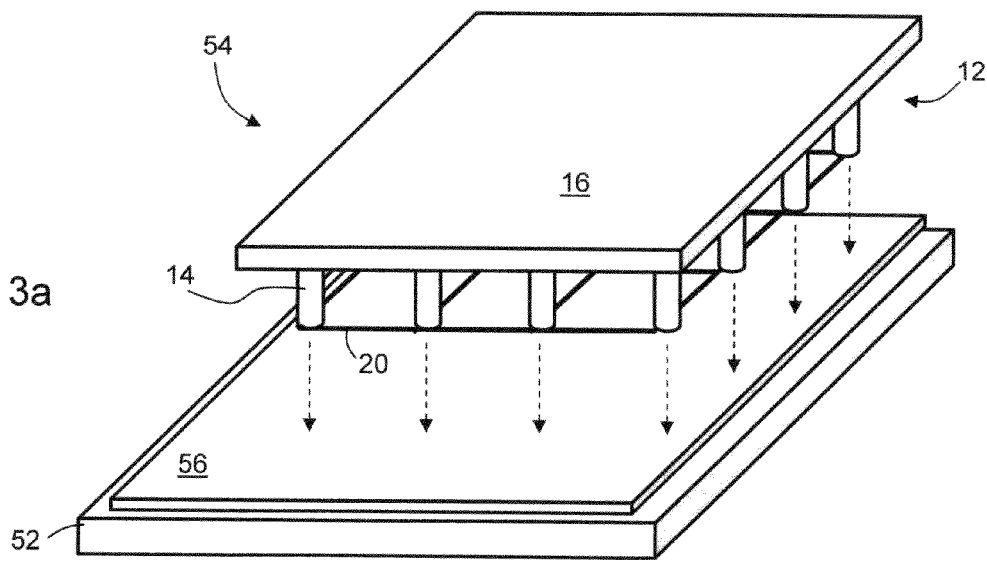
FIGS. 3a-c are schematic illustrations depicting several stages in the flowchart diagram of FIG. 2.
Figure 3B:
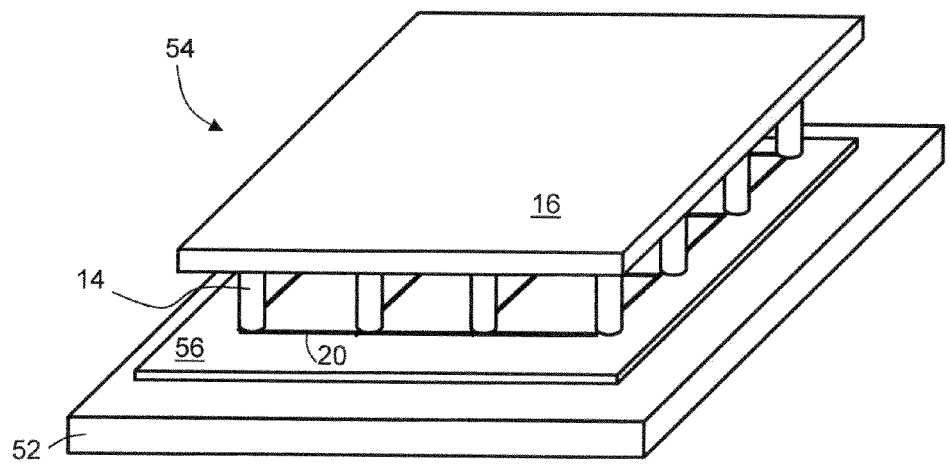
Figure 3C:
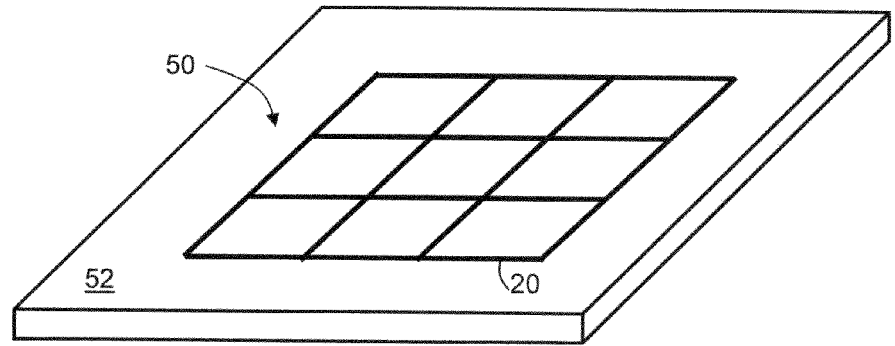

A method suitable for forming a nanotube network on a target substrate is illustrated in the flowchart diagram of FIG. 2 and process illustrations of FIGS. 3a-c.

It is to be understood that, unless otherwise defined, various steps of the method described hereinbelow can be executed either contemporaneously or sequentially in many combinations or orders of execution. Specifically, the ordering of the following flowchart diagrams is not to be considered as limiting. For example, two or more method steps, appearing in the following description or in the flowchart diagrams in a particular order, can be executed in a different order (e.g., a reverse order) or substantially contemporaneously. Additionally, several method steps described below are optional and may not be executed Referring conjointly to FIGS. 2 and 3a-c, the method begins at 40 and continues to 41 at which a target substrate 52 and a nanotube stamping device 54 are provided. Stamping device 54 can comprise template structure 12, including substrate 16 and pillars 14, and nanotubes 20 as further detailed hereinabove. Nanotubes 20 are preferably detachably supported by pillars 14 to allow transfer of nanotubes 20 to target substrate 52. Target substrate can be of any type and is preferably selected in accordance with the application for which the nanotube network is designed, representative examples include, without limitation, glass, quartz, silicon, plastic, polymeric material and the like. At least one advantage of the present embodiments is that the technique allows the formation of a nanotube network on many types of substrates because the nanotubes are transferred to the substrate rather than being grown thereon. For example, target substrate 52 can be polymeric substrate, particularly, but not obligatorily, a flexible polymeric substrate in which case the method can be used to form a nanotube network on a flexible substrate.

The method, optionally and preferably, continues to 42 at which target substrate 52 is prepared to the transfer. This can be done, for example, by applying a layer 56 of a buffering medium, preferably in a liquid form, on target substrate 52. Representative examples of buffering media suitable for the present embodiments include, without limitation, ethanol, hexane, de-ionized water, acetone, iso-propynol and photoresist. In some embodiments of the present invention ethanol is used as the buffering medium.

The advantage of using a buffering medium is that it reduces the potential disruptive effect of nano-scaled impurities or imperfections, which may be present on target substrate 52, on the transfer.

Whether or not a buffering medium is applied on target substrate 52, the method proceeds to 43 at which a contact is established (see FIG. 3b) between stamping device 54 and target substrate 52 so as to transfer nanotubes 20 from template structure 12 to target substrate 52 (see FIG. 3c), hence to form a nanotube network 50 on target substrate 52. The transfer is caused by the interactions between the suspended nanotube segments and target substrate 52. The detachment of nanotubes 20 from template structure 12 is enabled due to the relatively large surface contact area between nanotubes 20 and substrate 52, as opposed to the relatively small section of the nanotubes which contacts distal surfaces 24.

Although FIGS. 3a-b show that stamping device 54 is brought to a contact with target substrate 52 from above, this need not necessarily be the case, since in some embodiments stamping device 54 is brought to a contact with target substrate 52 from below. Furthermore although FIGS. 3a-b show that target substrate 52 is kept still and stamping device 54 is brought to a contact therewith, this need not necessarily be the case, since in some embodiments stamping device 54 is kept still and target substrate 52 is brought to a contact therewith, either from below or from above.

The ambient conditions at which the contact between stamping device 54 and target substrate 52 is established are selected such as to facilitate the transfer of the network to the target surface. For example, the contact can be at elevated temperatures. In some embodiments of the present invention the contact is established on the surface of a hot plate (heated, e.g., to about 100° C.) to allow rapidly evaporation of the buffering medium.

Also contemplated, is a stamping procedure under vacuum conditions. For example, once the buffering medium is applied and stamping device 54 is brought to contact with target substrate 52, both device 54 and substrate 52 can be placed in a vacuum chamber. Pumping can then be initiated so as to evacuate the buffering medium between the pillars, thereby to create pressure between stamping device 54 and target substrate 52.

Further contemplated is a technique in which a precursor stamp is used for the transfer. In this embodiment stamping device 54 is first pressed against a planar precursor stamp which may be a polymer, such as, but not limited to, polymethyl methacrylate (PMMA). The precursor stamp serves as a pliable layer which readily complies with the nano-topography caused by possible imperfections on the distal surfaces of the pillar and/or the target substrate. The pliable layer also adheres to the nanotubes. Subsequently, the precursor stamp can be presses against the target substrate and the polymer can be dissolved in a suitable solution (e.g., acetone).

The method ends at 44.

Figure 4:
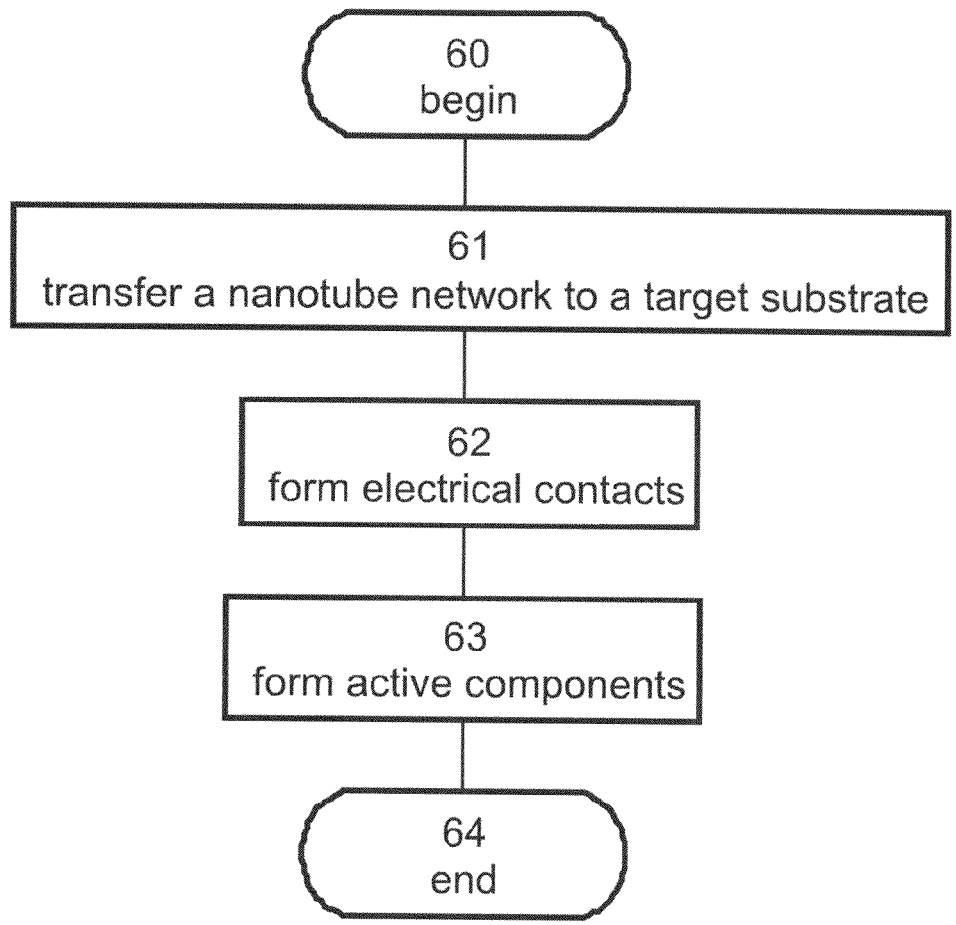
FIG. 4 is a flowchart diagram of a method suitable for fabricating a microelectronic device, according to various exemplary embodiments of the present invention.

FIG. 4 is a flowchart diagram of a method suitable for fabricating a microelectronic device, according to various exemplary embodiments of the present invention. The method begins as 60 and continues to 61 in which a nanotube network is transferred to a target substrate, e.g., by stamping. For example, a stamping device can be employed as further detailed hereinabove (see, e.g., the transfer of network 50 to substrate 52 by means of stamping device 54). The method continues to 62 at which a plurality of electrical contacts is formed on the target substrate. The electrical contacts can be form at intersecting points between two or more nanostructures or on a non-branched segment of a nanotube, as desired. The electrical contacts are preferably metallic.

Optionally and preferably the method continues to 63 at which one or more active components or devices, including, without limitation, diodes, transistors, supercapacitors, light emitters, electron emitters and the like, are formed on the substrate. The active components can be conventional micro- or nano-sized components. In some embodiments of the present invention one or more of the nanotubes are prepared as active components prior to the transfer to the target substrate. In some embodiments of the present invention one or more of the nanotubes are further processed once transferred to provide them with active properties. For example, once a nanotube is transferred to the target substrate, be made a transistor, e.g., by depositing a gate electrode thereon. Several active components can be formed along one segment of a nanotube, to form an array of active components. It was found by the inventors of the present invention that when a long and straight nanotube is transferred to the target substrate it can be further processed to form an array of substantially identical active components, such as transistors and the like.

The electrical contacts and/or active components can be formed on target substrate using any technique known in the art, including, without limitation, electron beam lithography and the like.

Figure 5A:
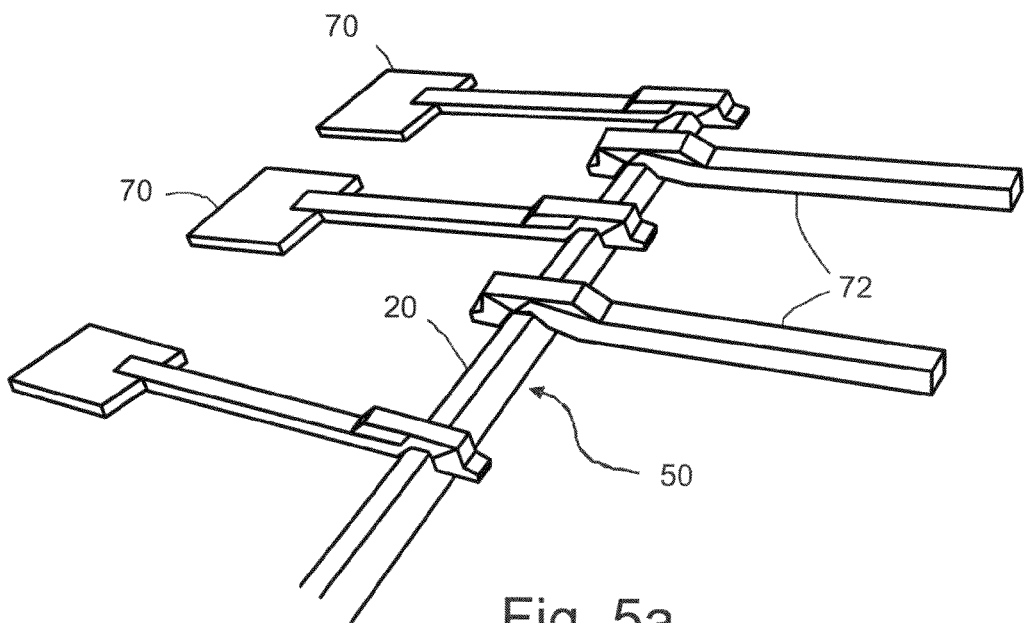
FIG. 5a is a fragmentary view illustrating a portion of a target substrate having thereon a nanotube, electrical contacts and electrodes, according to various exemplary embodiments of the present invention.

FIG. 5a is a fragmentary view illustrating a portion of target substrate 52 nanotube network 50 (one representative nanotube 20 is shown) and electrical contacts 70. Also shown in FIG. 5 are electrodes 72 deposited along nanotube 20 thereby rendering an array of active components therealong.

Figure 5B:
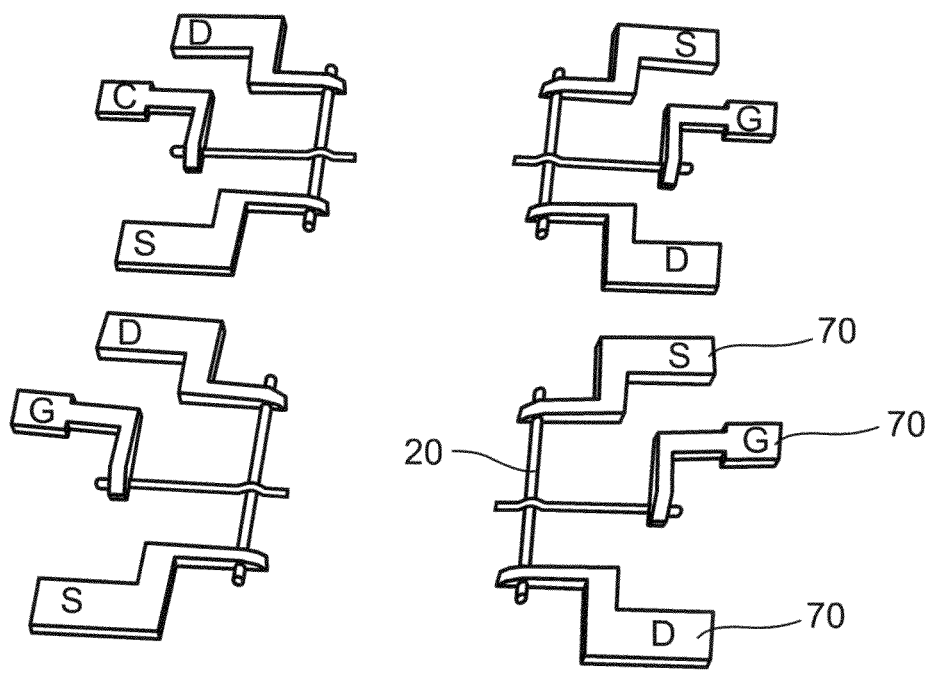
FIG. 5b is a fragmentary view illustrating a portion of a target substrate having thereon a nanotube network whereby pairs of intersecting nanotubes are connected to three electrical contacts in a source-gate-drain configuration, according to various exemplary embodiments of the present invention.

FIG. 5b schematically illustrate another example of nanotube network 50 whereby pairs of intersecting nanotubes 20 are connected to three electrical contacts in a source-gate-drain configuration.

The method ends at 64.

The method of the present embodiments can be used in the fabrication of many electronic devices.

For example, in some embodiments a memory medium device is fabricated from the nanotube network. In these embodiment an array of transistors is formed along each nanotube (see, e.g., FIG. 5a), wherein in each transistor a segment of the nanotube serves as a channel for electrons (or holes) between a source electrode and a drain electrode. A charge storage structure can be formed on the nanotube to store charges of electrons (or holes), and a gate electrode can be deposited on the charge storage structure to controls the movement of charge carriers. In operation, the conductivity of the nanotube depends in part on the charge stored by the charge storage structure. Based on the amount of current that flows through the nanotube, external circuit elements can determine if the charge storage structure is storing a logical "1" or a logical "0."

Figure 6:
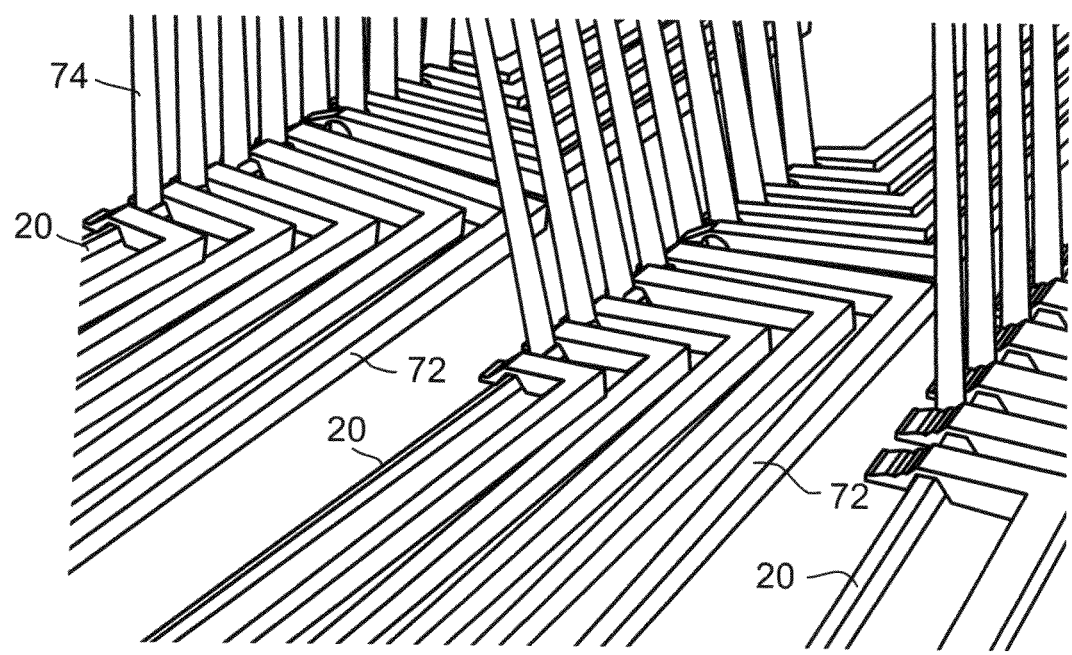
FIG. 6 is a fragmentary view illustrating a light emitting device employing a nanotube network, according to various exemplary embodiments of the present invention.

In some embodiments of the present invention a multiple infrared (IR) emission source is fabricated from the nanotube network. These embodiments utilize the IR emission properties of carbon nanotubes, when placed under ambipolar transistor conditions. In these embodiments, both electrons and holes are injected into the carbon nanotube. The recombination in the nanotube causes the emission of IR photons 74 (see FIG. 6). On a long straight segment of a carbon nanotube having a non-varying or minimally varying crystallographic structure, many parallel electrodes can be arranged, and each segment of nanotube can emit substantially the same IR wavelength. The stamping technique of the present embodiments can ensure that each segment of the nanotube emits the same or substantially the same wavelengths.

Using the stamping technique of the present embodiments, large arrays of nanotube segments can be created so as to arrange large numbers of IR emission sources, hence to form an array of IR pixels. Each different nanotube emits an IR wavelength defined by its structural properties. When the target substrate is flexible, a flexible IR emission source can be fabricated.

Figure 7:
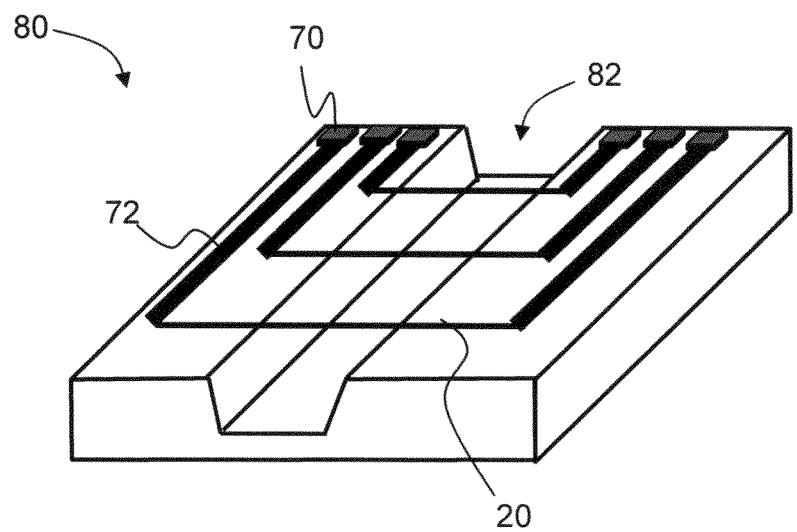
FIG. 7 is a fragmentary view illustrating a microfluidic flow sensing device employing a nanotube network, according to various exemplary embodiments of the present invention.

In some embodiments of the present invention a microfluidic flow sensing device 80 is fabricated from the nanotube network, as schematically illustrated in FIG. 7. In these embodiments, target substrate 52 can be made of a polymeric material suitable for microfluidic applications, such as, but not limited to, poly-dimethyl siloxane (PDMS). Target substrate 52 can comprise one or more microfluidic channels 82.

Using the stamping technique of the present embodiments, nanotubes 20 can be transferred to substrate 52 such that they are at an angle to the direction of flow in channel 82 (e.g., generally perpendicular to the channel). Electrodes 72 and contacts 70 can be deposited to establish electrical connections with other devices such as power source, display and the like (not shown). The motion of the fluid against the nanotubes creates a measurable change in the nanotubes properties, which can be measured via electrodes 72 and contacts 70 to identify flow and optionally determine the flow rate.

Figure 8:
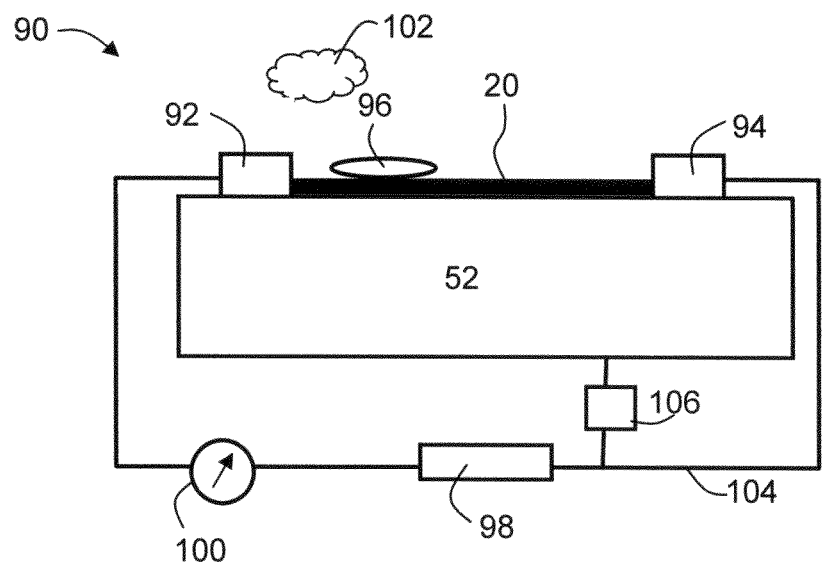
FIG. 8 is a fragmentary view illustrating a sensor device employing a nanotube network, according to various exemplary embodiments of the present invention.

In some embodiments of the present invention a sensor 90 is fabricated from the nanotube network, as illustrated in the cross sectional view of FIG. 8. In these embodiments nanotubes 20 are made such that their properties change when they are exposed to a substance 102. For example, when nanotubes 20 are carbon nanotubes, their electrical conductivity is changed by approximately three orders of magnitude within a few seconds when exposed to a gas, such as for example a nitrogen dioxide ($NO_2$) gas or an ammonia ($NH_3$) gas. In an $NH_3$ atmosphere, the electrical conductivity of the nanotubes is reduced, which can be explained by a shift in the valence band edge to well below the Fermi level of the nanotubes with resultant charge carrier depletion. Conversely, the electrical conductivity of the nanotubes rises by approximately three orders of magnitude if the nanotubes are exposed to an $NO_2$ atmosphere in a concentration of approximately 200 ppm. This can be explained by the fact that the Fermi energy of the nanotubes is shifted closer to the valence band and accordingly the number of charge carriers in the nanotubes increases.

Once nanotube network (only one nanotube 20 is shown for clarity) is transferred to substrate 52 one or more source electrodes 92 and one or more drain electrodes 94 are formed to establish electrical communication between the nanotubes and a voltage source 98. Electrodes 92 and 94 are connected via connection lines 104 to voltage source 98 which supplies the source-drain voltage and optionally a current meter 100. Part of substrate 52 can serve as back gate which can be connected to a voltage source 106 which supplies the gate voltage. For example, substrate 52 can be made of Si coated by a layer of $SiO_2$. Both the source-drain voltage and the gate voltage can be supplied using a multioutput power source as known in the art. In various exemplary embodiments of the invention a functionalization layer 96 is deposited on the nanotubes. In operation, variations in the electrical conductivity of the network are detected by current meter 100 which indicates presence and optionally amount of a substance which effects a change in the nanotubes' conductivity.

Other devices such as light emitting devices (not necessarily IR emitters), field emission cathodes, particularly, but not obligatorily, edge field emission cathodes can also be fabricated from the network of the present embodiments.

Reference is now made to FIGS. 9a-f which are schematic illustrations describing a method suitable for fabricating a suspended nanotube network, according to various exemplary embodiments of the present invention. The suspended nanotube network can be used for transferring the nanotube network to a target substrate, as further detailed hereinabove.

FIGS. 9a-d illustrate a preferred process for forming template structure 12. A substrate, for example, silicon dioxide wafer which comprises a thick layer (about 450 μm in thickness) of silicon coated by a thinner layer (about 500 nm) of silicon dioxide, is subjected to photo lithography patterning (FIG. 9a) followed by an exposure to light (e.g., UV exposure) and photo resist development (FIG. 9b). The patterning, exposure and development are for marking the x-y locations and siameters of the pillars. The diameter and spacing between pillars can vary.

An etching process is then applied (FIGS. 9c-d) to form the pillars. In some embodiments, the etching procedure includes reactive ion etching (RIE) of the oxide layer followed by deep reactive ion etching (DRIE) of the underlying silicon layer to a predetermined depth, depending on the desired height of the pillars.

Once the pillars are formed, a solution catalyst is applied, for example, by stamping on their distal surfaces. The catalyst can be any catalyst suitable for facilitating nanotubes growth. For example, in some embodiments of the present invention the catalyst includes nanoparticles of $Fe_2(NO)_3$ suspended in iso-propynol. Also contemplated is a thin layer of a transition metal, such as, but not limited to, Ni, Fe and Co. The application of catalyst can be, for example, by a stamping technique. In these embodiments, the catalyst solution is applied to a planar template surface, such as, but not limited to, a PDMS template surface, and contact is established between the template surface and the distal surfaces of the pillars, as illustrated in FIG. 9e.

The substrate carrying the pillars with the catalyst are then subjected to nanotube growth process, as known in the art. Any nanotube growth process can be employed, including, without limitation, chemical vapor deposition (CVD), thermal chemical vapor deposition, vapor phase growth, and the like. The growth process results in formation of a plurality of suspended nanotubes (see FIG. 9f) supported by the distal surfaces of the pillars as further detailed hereinabove.

Figure 9G:
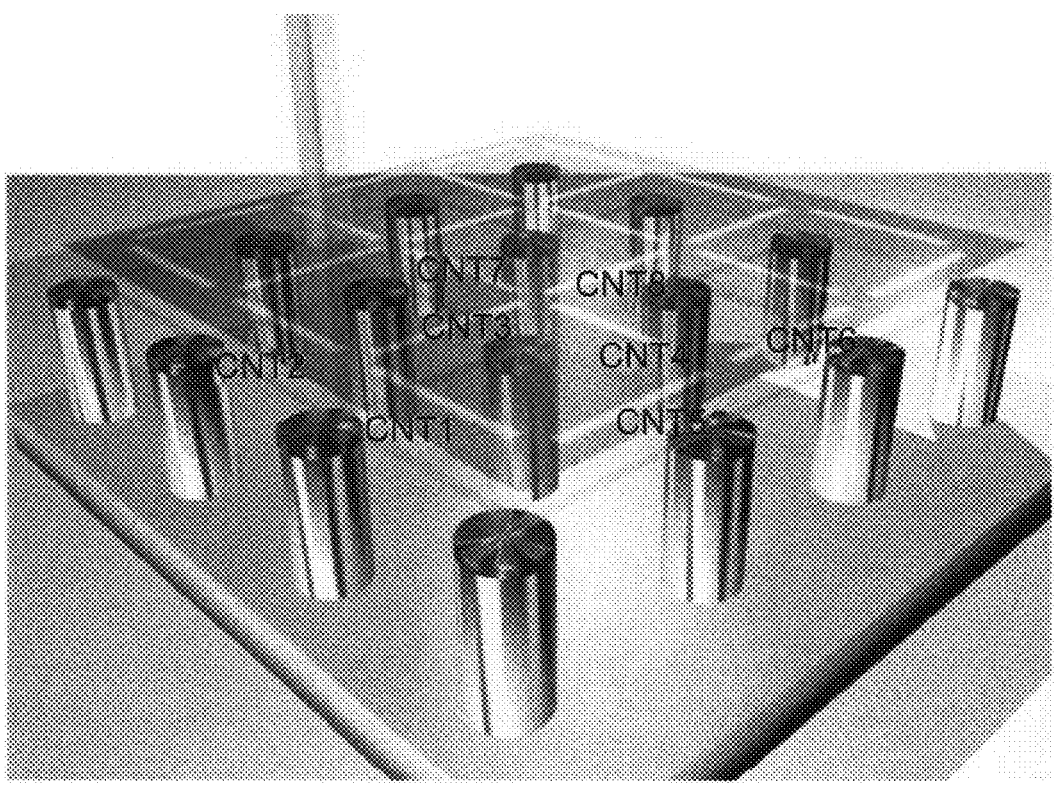

In various exemplary embodiments of the invention the suspended nanotubes are subjected to an analysis procedure in which the nanotubes are mapped according to their location, and at least one of characteristic diameters and characteristic chiralities, as further detailed hereinabove. The analysis can comprise, for example, Raman mapping (see FIG. 9g) which provide information regarding each individual suspended nanotube. Mapping is schematically represented in FIG. 9g as corresponding with the suspended network, where information the individual nanotubes is isolated and stored as indicated by the labels CNT1, CNT2, CNT3, etc.

As used herein the term "about" refers to ±10%.

The terms "comprises", "comprising", "includes", "including", "having" and their conjugates mean "including but not limited to".

The term "consisting of means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non limiting fashion.

The present examples describe experiments performed by the present inventors to form a network of single-walled carbon nanotubes, according to various exemplary embodiments of the present invention.

Formation of Suspended Network

Silicon pillars were created by first creating a pattern using standard photo-lithography techniques on a silicon dioxide wafer. This was followed by reactive ion etching (RIE) of a 500 nm thick oxide layer, and deep reactive ion etching (DRIE) to a depth of about 20 μm to form the pillars. The pillars were patterned with different spacing and diameters.

The pillared substrate was then prepared for CVD growth by stamping a solution of nanoparticles of $Fe_2(NO)_3$ suspended in iso-propynol onto the distal surfaces of the pillar. To this end, a flat PDMS template was used for the stamping process.

The feed gas for the CVD process was ethylene, at 900° C., for 9 min, with both the heating and cooling of the tube-furnace being accompanied by a constant flow of hydrogen gas, using an automated CVD control system.

FIG. 10 is a high-resolution scanning electron microscopy (HRSEM) showing 4 μm diameter, 20 μm high silicon pillars with bridging carbon nanotube growth. Dotted white arrows are visual aids corresponding to a few of the suspended nanotubes. The HRSEM revealed the high yield of bridging nanotube growth. The nanotubes extend between nearest-neighboring sets of pillars, with few diagonal pairs. The nanotubes were not found to be dependant upon the directionality of the gas flow within the tube furnace. The nanotubes are also visibly taut between the pillars. It is assumed that the mechanism driving the tautness of the suspended nanotubes concerns the interactions between nanotubes with one another, as well as between the nanotubes themselves. Specifically, suspended nanotubes adhere to one another, or to the surface, as much as possible, in an effort to attain maximal surface contact, while retaining a minimal free-energy configuration. This creates a type of "zipper-effect" which pulls the nanotubes into a tightly-bound network of suspended carbon nanotubes.

Verification of the growth of carbon nanotubes was implemented using transmission electron microscopy (TEM). Single-walled carbon nanotubes were grown directly onto silicon nitride TEM grids, containing large holes (40 μm square) in the viewing area. The nanotubes grew extended over the holes, producing taut networks of suspended nanotubes, similar to those extended between the pillars.

The results are shown in FIGS. 11a-b. FIG. 11a shows a low magnification TEM image of nanotubes grown over a hole, creating a tightly-bound network, as comparable to the pillar growth. The scale bar in FIG. 11a represents a length of 10 μm. FIG. 11b show a close up of a nanotube growing off the edge of a nitride grid. The nanotube is a single walled nanotube about 4 nm in width. The scale bar in FIG. 11a represents a length of 20 nm. The inset in FIG. 11b shows a close up of the fullerene-like tip of one of the single-walled nanotube (scale bar 10 nm).

Figure 12:
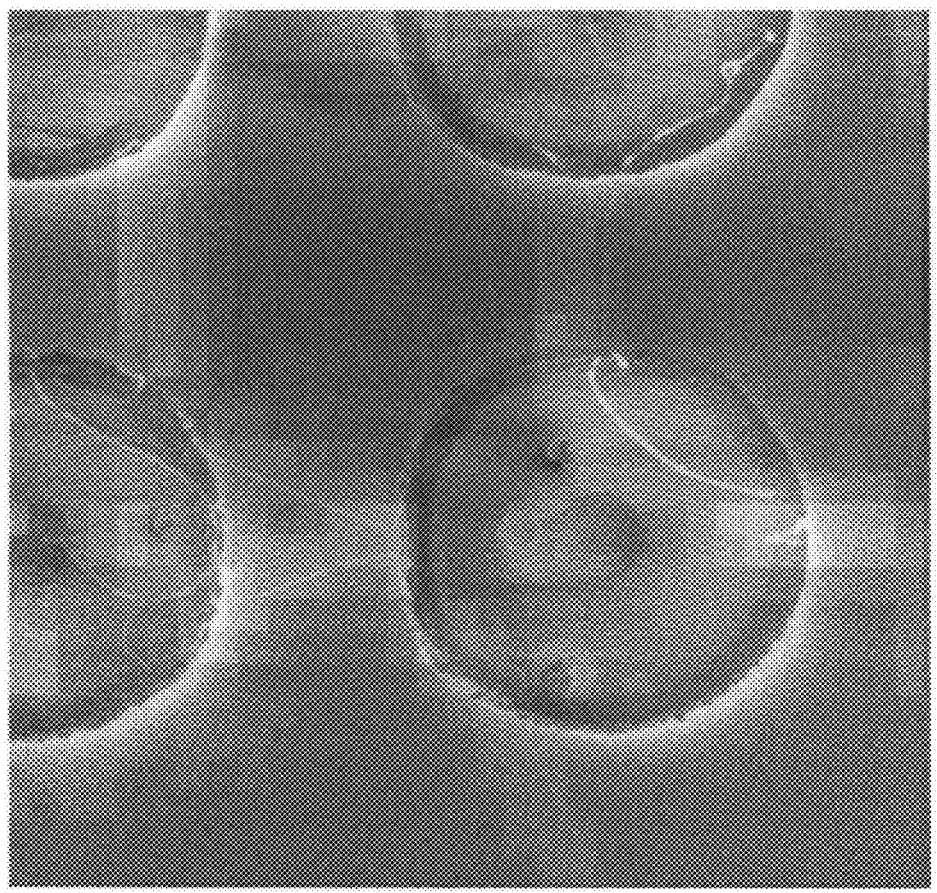
FIG. 12 shows a carbon nanotube network mapping as prepared using Raman spectroscopy in an experiment performed according to various exemplary embodiments of the present invention.

Once formed, the suspended nanotubes were individually assigned using a Raman spectroscopy mapping system. FIG. 12 shows a carbon nanotube network mapping results using Raman spectroscopy.

Transferring the Suspended Network to a Target Substrate

The stamping of the nanotubes onto a target substrate was via a buffering medium which assisted the nanotubes to snap-off the distal surfaces of the pillar, and adhere to the target substrate. Using either ethanol or hexane, which evaporate in air relatively quickly, the stamping of individually isolated nanotubes was facilitated.

Stamping procedure under vacuum conditions was also tested. Once the buffering medium was applied and the pillars contacted the target substrate, both the stamping device and target substrate were placed in a vacuum chamber. Pumping can was initiated so as to evacuate the buffering medium between the pillars and to create pressure between both the pillars and the target substrate.

The cause for the nanotube's transferal to the target surface was due to the interactions between the suspended tube segment and the new target substrate. The nanotubes snap-off the distal surface of the pillar due to the large surface contact area between the nanotubes and the target substrate, as opposed to the section of nanotubes adhering to the pillars.

Figure 13:
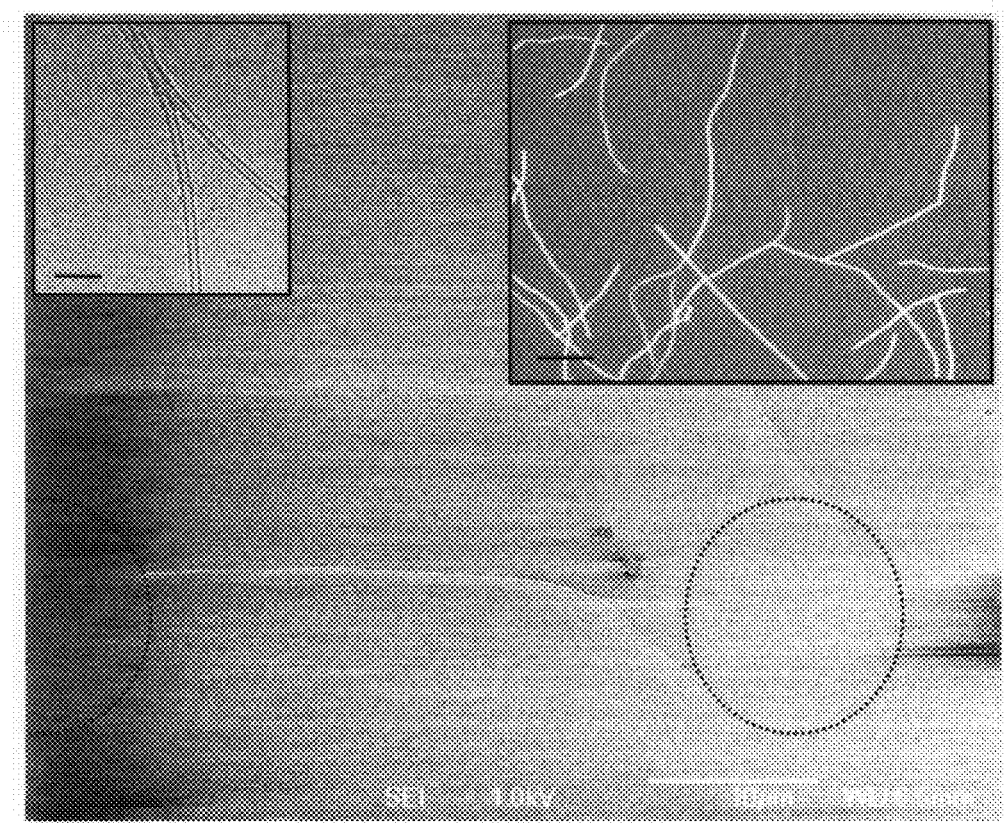
FIG. 13 show SEM (main panel) and TEM (inset) images of carbon nanotubes transferred to a target substrate using hexane as a buffering medium during an experiment performed according to various exemplary embodiments of the present invention.

FIG. 13 displays an example of hexane-facilitated transfer of carbon nanotubes. The main panel of FIG. 13 is an HRSEM image. The thin circle corresponds to the location of the pillar tops of the silicon stamps. Note the length and straightness of the tube segments. The scale bar in the main panel of FIG. 13 represents a length of 10 μm. The left inset of FIG. 13 is a TEM image of a y-junction between two nanotubes, as similar to the y-junctions in the main image. The scale bar in the left inset of FIG. 13 represents a length of 20 nm. The right inset in FIG. 13 shows a conventional CVD growth of carbon nanotubes. The scale bar in the left inset of FIG. 13 represents a length of 1 μm. Comparing the right inset with the left inset and main it is demonstrated that the present embodiments successfully provide isolated nanotubes unlike conventional technique.

Figure 14:
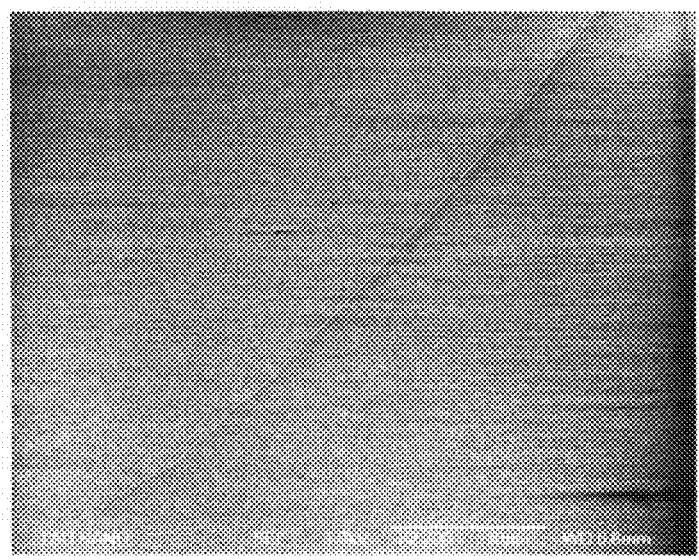
FIG. 14 is a HRSEM image of carbon nanotubes transferred in vacuum conditions to a target substrate using ethanol as a buffering medium during an experiment performed according to various exemplary embodiments of the present invention.

FIG. 14 shows an example of a vacuum-assisted transfer, using ethanol as the buffering medium. Shown in FIG. 14 is a long nanotube, about 40 μm in length, which is isolated on the target substrate. As shown the nanotube is relatively straight.

Manufacturing of Devices

Creating large-scale circuits or devices using the technique of the present embodiments can be implemented either by stamping the nanotubes directly onto preexisting device architectures or by stamping them onto clean substrates and adding the circuitry thereafter. Both of these techniques are demonstrated in the present example and FIGS. 15a-d.

A very long and straight single-walled carbon nanotube, imprinted onto a clean silicon dioxide substrate (500 nm thick on p-type silicon) was contacted after imprinting by using e-beam lithography. Cr—Au electrodes (8 and 20 nm, respectively) and the underlying silicon were used to measure typical p-type nanotube transistor characteristics with a drain-source voltage of 100 mV.

Figure 15:
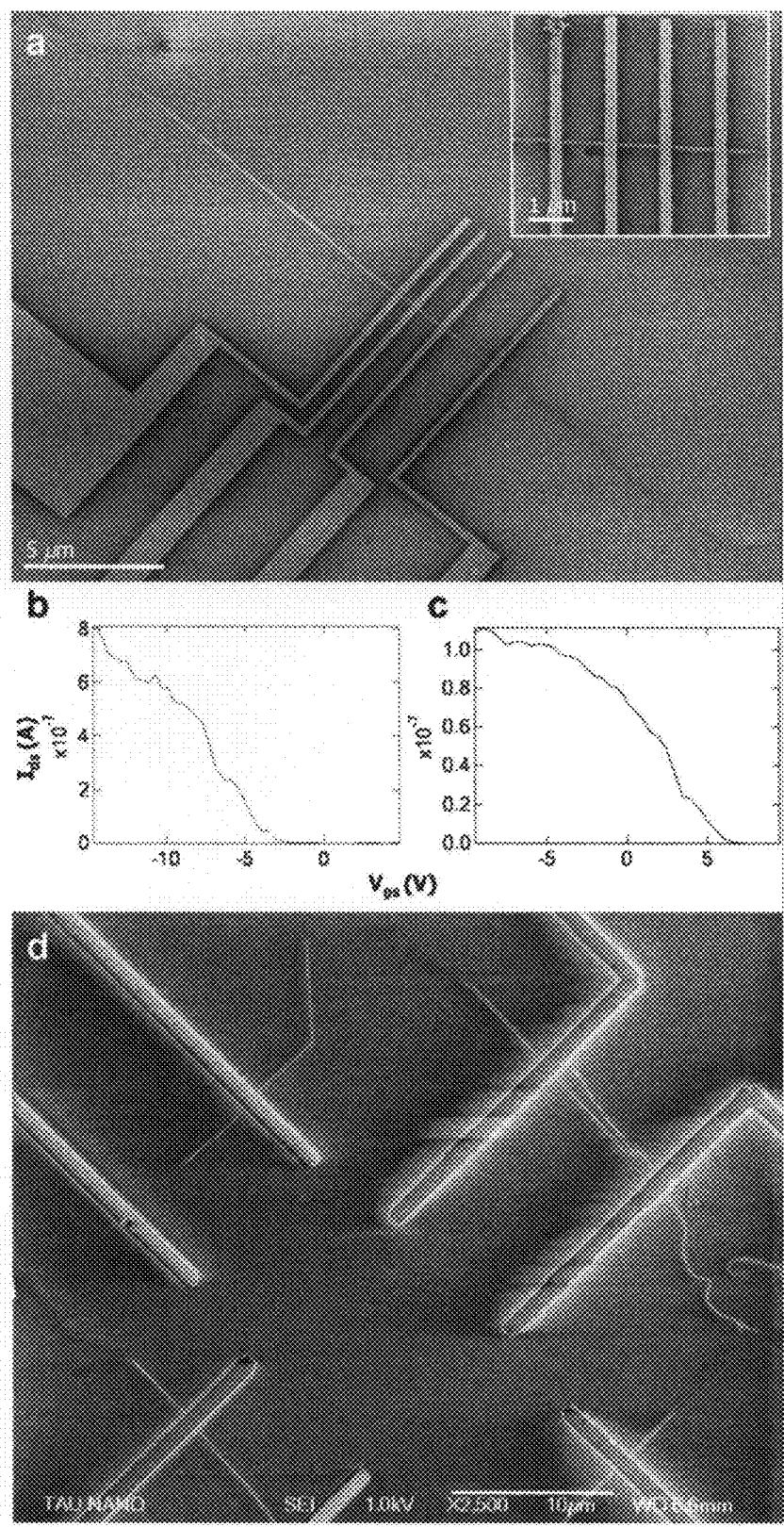
FIG. 15a show electrodes placed over a long nanotube during an experiment performed according to various exemplary embodiments of the present invention.
FIGS. 15b-c are graphs showing electrical characteristics of nanotube transistors as measured during an experiment performed according to various exemplary embodiments of the present invention.
FIG. 15d is an HRSEM image of a patterned nanotube device architecture prepared during an experiment performed according to various exemplary embodiments of the present invention.

FIG. 15a is an HRSEM image of the electrodes placed at varying distances (0.5, 1 and 3 μm) over the long nanotube. The inset in FIG. 15a shows a close up image of the nanotube transistor formed of equally spaced chrome-gold electrodes placed over a stamped nanotube (1 μm spacing).

FIG. 15b is a graph showing the electrical characteristics of the nanotube transistor. Shown in FIG. 15b displays is a semi-logarithmic I-V curve of the p-type, nanotube transistor, with a 0.5 μm channel length (the leftmost set of electrodes in FIG. 15a), with the electrodes added after imprinting. The on-off gain ratio of this transistor was of 2 orders of magnitude, with a saturation current of 0.8 μA, and a residual off current of 3 nA.

FIG. 15c is a graph showing the electrical characteristics of a p-type nanotube transistor with a channel length of 4 μm fabricated by placing an individual single-walled carbon nanotube between two existing electrodes (image of this nanotube transistor is not shown). Shown in FIG. 15c is a semi-logarithmic I-V curve for the nanotube transistor. The on-off gain ratio was over 4 orders of magnitude, with a saturation current of 0.1 μA and an off current of a few picoamperes. The discrepancy in the performances of these transistors can be explained by the difference in work functions of the metal in contact with the nanotube. When the electrodes are placed after the nanotubes were transferred, chrome (work function of 4.5 eV) was in contact with the nanotube, and when the nanotubes were transferred to a target substrate already having electrodes thereon, gold (work function of 5.1 eV) was in contact with the nanotube.

The different in surface properties of the two samples may also contribute to the observable shift in the threshold voltage. Overall, the nanotube transistors of the present embodiments demonstrate characteristics suitable for many practical applications.

FIG. 15d demonstrates a complex device architecture that is easily obtainable using the technique of the present embodiments. FIG. 15d is a HRSEM image of a patterned nanotube device fabricated using the stamping method of the present embodiments. The square-like formation of the nanotubes originates from the square array of the pillars. FIG. 15d displays the advantageous use of stamping multiple nanotubes in a prearranged pattern, with perpendicular nanotubes transferred in a single step.

Figure 16:
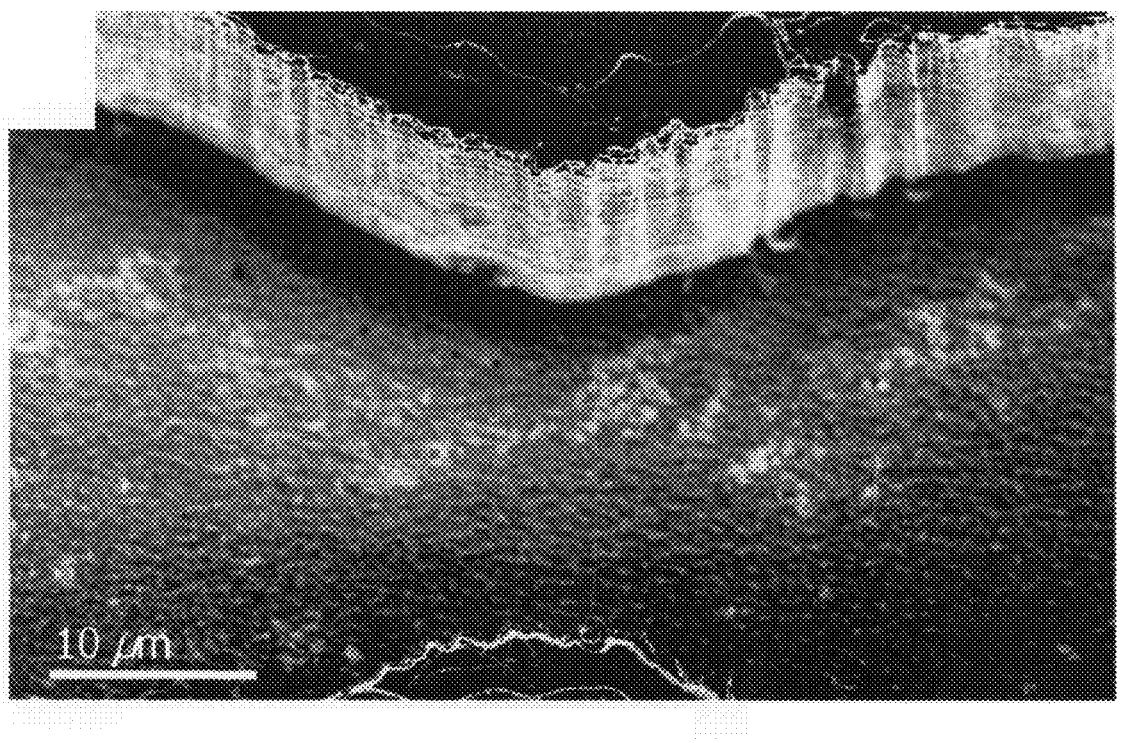
FIG. 16 is a HRSEM image of a prototype microfluidic flow sensing device manufactured according to various exemplary embodiments of the present invention.

FIG. 16 is a HRSEM image of a prototype microfluidic flow sensing device manufactured according to various exemplary embodiments of the present invention. Shown in FIG. 16 are two nanotubes (marked by arrows) stretched between electrodes over a microfluidic channel formed in a silicon substrate.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A stamping device for stamping a nanotube network onto a target substrate, comprising:
    a template structure having a support structure formed on or attached to a substrate, said support structure comprising a plurality of spatially separated pillars, each having a proximal surface and a distal surface relative to said substrate, wherein said pillars are arranged generally perpendicularly to said substrate such that the distal surfaces of said pillars define a plane being spatially separated from said substrate; and a plurality of nanotubes, grown on, and being detachably supported by, said pillars to engage said plane.

2. The device of claim 1, wherein a spacing between adjacent pillars of said plurality of spatially separated pillars is at least a few tens of micrometers.

3. The device of claim 2, wherein said spatially separated pillars are arranged in two-dimensional arrangement such that at least three pillars are not aligned along a single straight line.

4. A kit, comprising a nanotube characteristics map and the device of claim 1, wherein said nanotube characteristics map identifies each nanotube according to a location and at least one characteristic selected from the group consisting of a characteristic diameter and a characteristic chirality.

5. The device of claim 1, wherein a connection between said nanotubes and said support structure is selected such that when the nanotube network contacts or being pressed against the target substrate, said nanotubes are detached from said support structure and are being transferred from said support structure to the target surface.

6. The device of claim 2, wherein a height of each pillar is from about 10 μm to about 50 μm.

* * * * *